United States Patent [19]

Bowers

[11] 4,170,140

[45] Oct. 9, 1979

[54] AMPLITUDE DETECTION CIRCUIT

[75] Inventor: Mark C. Bowers, Rochester, Mich.

[73] Assignee: Sun Electric Corporation, Chicago, Ill.

[21] Appl. No.: 907,169

[22] Filed: May 18, 1978

[51] Int. Cl.² ............................................. G01M 1/22
[52] U.S. Cl. ..................................................... 73/462
[58] Field of Search ........................... 73/116, 462–465, 73/457

[56] References Cited

U.S. PATENT DOCUMENTS

| 3,056,300 | 10/1962 | Lash et al. | 73/462 |
| 3,307,408 | 3/1967 | Thomas et al. | 73/462 |
| 3,623,374 | 11/1971 | Baner | 73/462 |

Primary Examiner—James J. Gill
Attorney, Agent, or Firm—Allegretti, Newitt, Witcoff & McAndrews

[57] ABSTRACT

An amplitude detection circuit utilizing a pair of polarity reversing amplifiers is disclosed.

6 Claims, 1 Drawing Figure

AMPLITUDE DETECTION CIRCUIT

BACKGROUND OF THE INVENTION

The present invention relates generally to an amplitude detection circuit, and more particularly, to an amplitude detector for use in conjunction with an engine imbalance testing system.

Prior to installation in an automobile, an engine is tested for rotational imbalance. Weights are then added to or subtracted from the engine to counteractingly reduce the imbalance to an acceptable level.

Rotational imbalance is sensed and measured by a test system, including an engine mount, or test stand, and a transducer. The engine is placed in the test stand and operated at the test speed (RPM). The transducer is coupled to the engine and provides an electrical signal. A component of that signal represents engine imbalance.

The imbalance component is a sinusoidal signal, having a substantially constant amplitude and a frequency dependent upon RPM. More particularly, the period of the imbalance component is identical to the time between successive top dead center points of the engine.

To determine the imbalance and the necessary corrective action, only the amplitude of the imbalance component must be measured. The transducer signal must, therefore, be demodulated to segregate the imbalance component.

Demodulation is particularly difficult due to variation in RPM and resulting variation in the frequency of the imbalance component. Presently available demodulation circuits also add a DC bias to the output signal, such that the output amplitude is dependent upon the amplitude of the demodulating signal. Variations in the demodulating signal will thus reduce the accuracy of measurement.

SUMMARY OF THE INVENTION

In a principal aspect, the present invention is an amplitude detection circuit, used in conjunction with an engine imbalance test system. The amplitude detection circuit includes trigger means coupled to the engine, a pair of polarity reversing amplifiers, a pair of filters and a vector magnitude circuit.

Both polarity reversing amplifiers receive a signal, including the imbalance component, from the engine imbalance test system. Responsive to the trigger means, the amplifiers provide positive and negative amplification, such that introduction of a DC bias is substantially avoided. One amplified output is also phase shifted with respect to the other.

The filters pass the imbalance component received from the respective polarity reversing amplifiers to the vector magnitude circuit. The magnitude circuit responsively provides a DC representation of the amplitude of the imbalance component.

It is thus an object of the present invention to provide an amplitude detection circuit. Another object is to provide a demodulation circuit which does not add a DC bias to the output signal. Still another object is to provide an amplitude detector which is substantially independent of frequency variation in the signal under investigation. Another object is to provide an amplitude detector having an output signal which is not a function of amplitude of a trigger signal associated with the trigger means.

These and other features, objects and advantages of the present invention are set forth in the following detailed description of a preferred embodiment.

BRIEF DESCRIPTION OF THE FIGURE

A preferred embodiment of the present invention will be described with reference to FIG. 1, an electrical schematic illustrating an engine imbalance test system incorporating the present invention.

DESCRIPTION OF A PREFERRED EMBODIMENT

Figure 1:
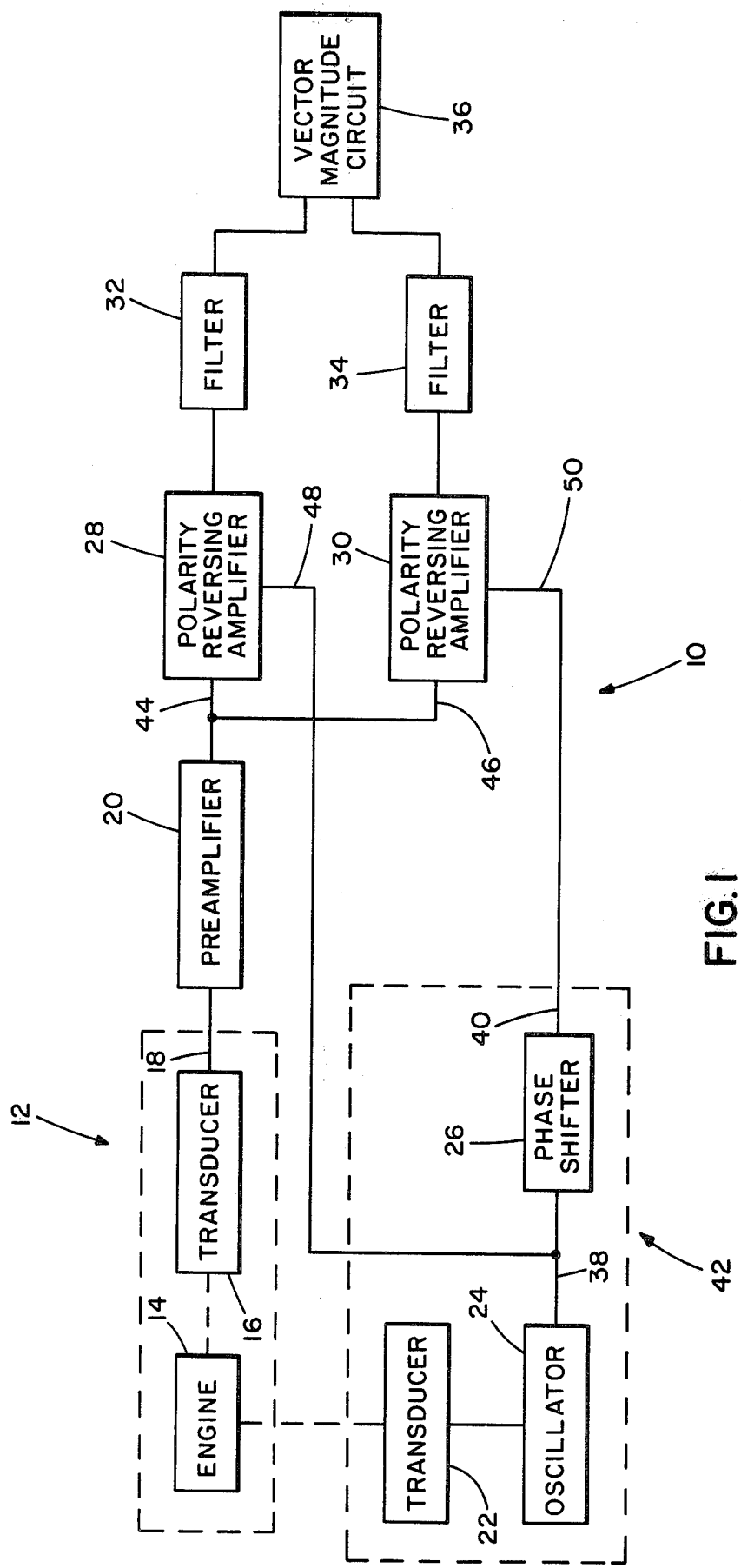

Referring to FIG. 1, a preferred embodiment of the present invention is shown as an amplitude detection circuit 10. The circuit 10 is used in connection with an engine test system, generally designated 12. More particularly, the engine test system 12 senses the imbalance of an engine 14 through a transducer 16. The transducer 16 produces a signal at an output 18 which includes a sinusoidal component representing the engine imbalance.

As shown, the circuit 10 includes a preamplifier 20, a transducer 22, an oscillator 24, a phase shifter 26, first and second polarity reversing amplifiers 28, 30, respectively, first and second filters 32, 34, respectively, and a vector magnitude circuit 36, interconnected as shown. The transducer 22, coupled to the engine 14, senses top dead center and triggers the oscillator 24.

The oscillator 24, which includes a phase lock loop, responsively provides, at an output 38, a digital trigger signal having a frequency dependent upon the speed of the engine. More particularly, the oscillator 24 produces a trigger signal having a period equivalent to the time between successive top dead center points of the engine 14, as sensed by the transducer 22. The trigger signal is HIGH, or 1, for the first half cycle and LOW, or 0, for the second half cycle.

The phase shifter 26 receives the trigger signal from the oscillator 24. The phase shifter 26 produces a second trigger signal at an output 40, which corresponds to the trigger signal from the oscillator 24, only shifted one quarter cycle, or 90°. Cooperatively, the transducer 22, oscillator 24 and phase shifter 26 define trigger means, generally designated 42, for generating the first and second trigger signals.

The signal of the transducer 16 is received and amplified by the preamplifier 20. It should be understood that this signal contains many extraneous components, resulting from spark plug firings, etc. The component is of interest, i.e., the sinusoidal component representing engine imbalance, is a relatively low frequency, low amplitude signal.

The first and second polarity reversing amplifiers 28, 30 each receive the signal from the preamplifier 20 at signal inputs 44, 46, respectively. At a first trigger input 48, the first polarity reversing amplifier 28 receives the first trigger signal of the trigger means 42. The second polarity reversing amplifier 30 receives the second trigger signal of the trigger means 42 at a second trigger input 50.

The first and second polarity reversing amplifiers 28, 30 are identical and have an identical, predetermined gain, e.g., four. When the signal at the trigger inputs 48, 50 is HIGH, or 1, the gain of the first and second polarity reversing amplifiers 28, 30 is positive; when the trigger input is LOW, or 0, the gain is negative.

The output signals of the polarity reversing amplifiers 28, 30 are filtered by the filters 32, 34, respectively, and received by the vector magnitude circuit 36. In this preferred embodiment, the filters 32, 34 are low pass filters having a band width of 1-4 Hertz.

The output of the vector magnitude circuit 36 is a DC signal, representing the summation or magnitude of the two input signals. More particularly, the vector magnitude circuit 36 squares and sums the signals received from the first and second filters 32, 34, and provides a DC output representing the square root of the summation.

The signal received by the polarity reversing amplifiers 28, 30 can be represented by the following equation: $A \cos(wt+\phi) + x(t)$, where $A \cos(wt+\phi)$ is the imbalance sinusoidal component, $x(t)$ is extraneous information, or noise, and $\phi$ is an unknown angle between the unbalanced sinusoidal component and the top dead center trigger signal. This signal is amplified positively for one half of a cycle, or period, and negatively for the other half cycle. With this amplification, no DC bias is added to the amplified signal by the polarity reversing amplifiers 28, 30.

The phase shift of the second trigger signal, received by the second polarity reversing amplifier 30, with respect to the first trigger signal results in a similar phase shift in the amplified output signal of the second polarity reversing amplifier 30. That is, the sinusoidal component representing engine imbalance is shifted one quarter cycle and can be thereafter represented, ignoring amplification, as follows: $A \cos(w(t)+\phi+90°)$ or $-A \sin(w(t)+\phi)$ with respect to the second trigger signal.

Amplification by the first and second polarity reversing amplifiers 28, 30, as triggered by the trigger means 42, also substantially reduces the amplitude of the higher frequency or "noise" components. This facilitates segregation of the significant low frequency imbalance component by the first and second filters 32, 34.

The two input signals to the vector magnitude circuit 36 can thus be substantially represented as follows: $KA \cos\phi$ and $-KA \sin\phi$, where K is a constant for the detection circuit 10. The summation process of the vector magnitude circuit 36 eliminates the cosine and sine functions, such that the output signal is proportional to the amplitude, A, of the imbalance component.

A single preferred embodiment of the present invention has been disclosed herein. It is to be understood, however, that various changes and modifications can be made without departing from the true scope and spirit of the present invention, as defined in the following claims.

What is claimed is:

1. In a system for testing an engine, said system producing a signal including a sinusoidal component, said sinusoidal component having an amplitude and a frequency dependent upon the speed of said engine, an improved means for determining said amplitude comprising, in combination:

trigger means coupled to said engine for generating a first trigger signal and a second trigger signal, said first trigger signal and said second trigger signal having a frequency dependent upon the speed of said engine, said second trigger signal corresponding to said first signal phase shifted a quarter cycle;

a first polarity reversing amplifier having a first input receiving said signal and a first trigger receiving said first trigger signal;

a second polarity reversing amplifier having a second input receiving said signal and a second trigger input receiving said second trigger signal;

a first filter and a second filter connected to said first polarity reversing amplifier and said second polarity reversing amplifier, respectively; and a vector magnitude circuit responsive to said first filter and said second filter.

2. An improved means as claimed in claim 1 wherein said trigger means includes transducer means for sensing atop dead center of said engine and an oscillator responsive to said transducer.

3. An improved means as claimed in claim 2 wherein said oscillator has a phase lock loop and provides a digital output being high for the first half cycle and low for the second half cycle.

4. An improved means as claimed in claim 3 wherein said trigger means further includes a phase shifter responsive to said oscillator to provide said second trigger signal.

5. An improved means as claimed in claim 1 further comprising a preamplifier interconnected between said system and said first and second polarity reversing amplifiers.

6. An improved means as claimed in claim 1 where said first and second filters are low pass filters.

* * * * *